United States Patent
Kitagawa et al.

(10) Patent No.: US 10,937,473 B2
(45) Date of Patent: Mar. 2, 2021

(54) CLOCK SIGNAL DRIVERS FOR READ AND WRITE MEMORY OPERATIONS

(71) Applicant: Micron Technology, Inc., Boise, ID (US)

(72) Inventors: Katsuhiro Kitagawa, Tokyo (JP); Akira Yamashita, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/058,687

(22) Filed: Aug. 8, 2018

(65) Prior Publication Data

US 2020/0051603 A1 Feb. 13, 2020

(51) Int. Cl.
*G11C 7/22* (2006.01)
*G11C 7/10* (2006.01)

(52) U.S. Cl.
CPC ............ *G11C 7/222* (2013.01); *G11C 7/1006* (2013.01); *G11C 7/1039* (2013.01); *G11C 7/1096* (2013.01)

(58) Field of Classification Search
CPC ..... G11C 7/222; G11C 7/1006; G11C 7/1039; G11C 7/1096
See application file for complete search history.

(56) References Cited

U.S. PATENT DOCUMENTS

| | | | | |
|---|---|---|---|---|
| 6,029,252 A | * | 2/2000 | Manning | G06F 1/06 713/600 |
| 6,101,197 A | * | 8/2000 | Keeth | G06F 1/10 370/503 |
| 6,337,832 B1 | * | 1/2002 | Ooishi | G11C 7/1045 365/219 |
| 6,775,755 B2 | * | 8/2004 | Manning | G06F 5/06 711/105 |
| 7,536,666 B1 | * | 5/2009 | Lee | G06F 17/5077 326/101 |
| 9,818,462 B1 | * | 11/2017 | Polney | G11C 7/1084 |
| 2012/0230144 A1 | * | 9/2012 | Nagata | G11C 8/18 365/233.11 |
| 2012/0250433 A1 | * | 10/2012 | Jeon | G11C 8/18 365/193 |
| 2013/0141994 A1 | * | 6/2013 | Ito | G11C 7/22 365/193 |
| 2013/0155792 A1 | * | 6/2013 | Matsui | G11C 7/222 365/193 |
| 2018/0122438 A1 | * | 5/2018 | Manning | G11C 7/22 |
| 2019/0172512 A1 | * | 6/2019 | Oh | G11C 8/18 |
| 2019/0348105 A1 | * | 11/2019 | Brown | G06F 11/10 |

* cited by examiner

*Primary Examiner* — Mushfique Siddique
(74) *Attorney, Agent, or Firm* — Perkins Coie LLP

(57) ABSTRACT

Drivers for read and write operations of memory arrays are described. In one aspect, a memory device can include an input/output (I/O) circuit to facilitate read and write operations with the memory device. One driver can generate clock signals for the command circuit to aid with the performance of the write operations. Another driver can generate clock signals for the I/O circuit to aid with the performance of the read operations.

20 Claims, 4 Drawing Sheets

CLOCK SIGNAL DRIVERS FOR READ AND WRITE MEMORY OPERATIONS

TECHNICAL FIELD

The present disclosure generally relates to memory devices and systems, and more particularly to clock signal drivers for read and write memory operations.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Some of the material described in this disclosure includes devices and techniques for using separate clock drivers to provide phase-shifted clock signals for use in read and write operations in a memory device. For example, many memory devices, such as double data rate (DDR) DRAM devices, include circuitry for read and write (or write and command) operations to read data and store data, respectively, in the memory device. Many different clock signals can be employed to allow the memory device to provide high-performance reading and writing from and into the memory.

Often, a single driver is used to provide four phase shifted clock signals to be used for the write and read operations. For example, a driver can drive clock signals for a first clock signal (e.g., a clock signal that is at a reference point that is 0 degrees phase shifted), a second clock signal that is 90 degrees phase shifted with respect to the first clock signal, a third clock signal that is 180 degrees phase shifted with respect to the first clock signal, and a fourth clock signal that is 270 degrees phase shifted with respect to the first clock signal. The first and third clock signals (i.e., 0 and 180 degree phase shifted clock signals) are used for write (as well as command) operations. By contrast, all four clock signals (i.e., 0, 90, 180, and 270 degree phase shifted clock signals) are used for the read operations.

As disclosed herein, separate clock drivers can be implemented to generate separate groups of phase shifted clock signals for the write and read operations. For example, a first driver can be used to generate, or drive, the 0 and 180 degree phase shifted clock signals. That is, the first driver can provide two phase shifted clock signals for use with write operations because these are the only phase shifted clock signals used for write operations. However, a second driver can be used to generate, or drive, all four of the 0, 90, 180, and 270 degree phase shifted clock signals for use with read operations.

By having two separate drivers to provide the phase shifted clock signals for write and read operations, power consumption can be reduced. For example, if read operations are not being performed, then the second driver can be provided input signals such that the four phase shifted clock signals are not toggling. Thus, only the first driver providing two phase shifted clock signals can be operating, rather than having a single driver driving four phase shifted clock signals of which only the two for write operations are used by the memory device (as in previous approaches).

Figure 1:
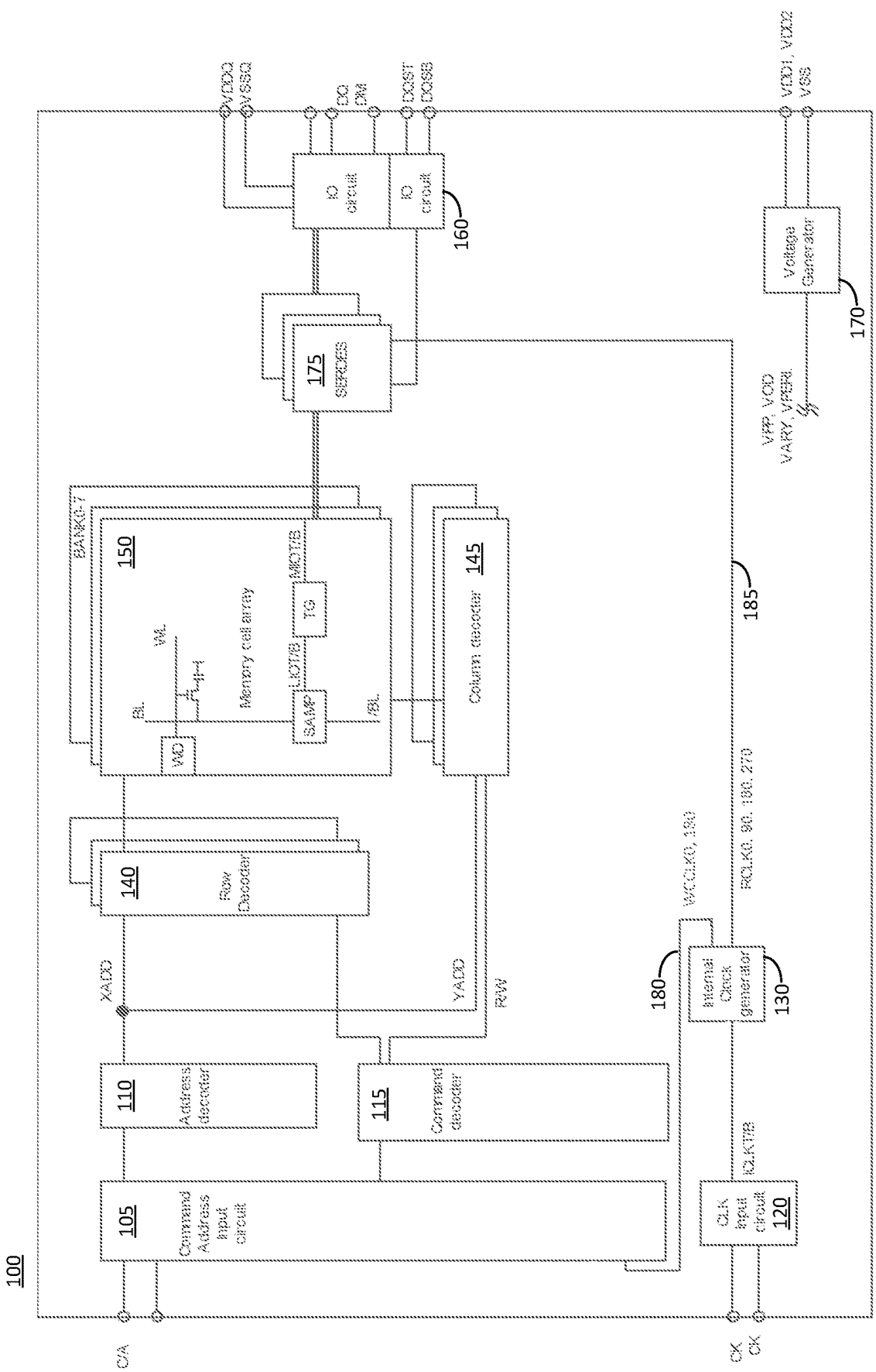
FIG. 1 is a simplified block diagram schematically illustrating a memory device in accordance with an embodiment of the present technology.

In more detail, FIG. 1 is a block diagram schematically illustrating a memory device 100 in accordance with an embodiment of the present technology. Memory device 100 may include an array of memory cells, such as memory cell array 150 as well as a variety of memory-related circuitry to interface with memory cell array 150. Memory cell array 150 may include a plurality of banks (e.g., banks 0-7 in the example of FIG. 1), and each bank may include a plurality of word lines (WL), a plurality of bit lines (BL), and a plurality of memory cells arranged at intersections of the word lines and the bit lines. The selection of a word line WL may be performed by row decoder 140, and the selection of a bit line BL may be performed by column decoder 145.

Memory device 100 may employ a plurality of external terminals that include command and address terminals coupled to a command bus and an address bus to receive command signals and address signals C/A. Clock signals can be provided to CLK input circuit 120. Power supply terminals VDD1, VDD2, VSS, VDDQ, VSSQ can be used to provide power supplies to the various components of memory device 100 including voltage generator 170 and Input/Output (I/O) circuit 160. Data terminals DQ, data related terminals DM, DQST, and DQSB can also be provided to I/O circuit 160.

The command and address terminals may be supplied with an address signal and a bank address signal from outside, for example, from other circuitry such as a memory controller. The address signal and the bank address signal supplied to the address terminals can be transferred, via a command/address input circuit 105, to an address decoder 110. The address decoder 110 can receive the address signals and supply a partially decoded row address signal (XADD) to the row decoder 140, and a partially decoded column address signal (YADD) to the column decoder 145. The address decoder 110 can also receive a bank address signal BADD (not depicted) and supply the bank address signal to both the row decoder 140 and the column decoder 145.

The command and address terminals provided to command/address input circuit 105 may be supplied with command signals, address signals, and chip selection signals, from a memory controller. The command signals may represent various memory commands from the memory controller (e.g., including access commands, which can include read commands and write commands). The select signal may be used to select the memory device 100 to respond to commands and addresses provided to the command and address terminals. When an active chip selection signal is provided to the memory device 100, the commands and addresses can be decoded and memory operations can be performed. The command signals may be provided as internal command signals to a command decoder 115 via the command/address input circuit 105. The command decoder 115 may include circuits to decode the internal command signals to generate various internal signals and commands for performing memory operations, for example, a row command signal to select a word line and a column command signal to select a bit line. The internal command signals can also include output and input activation commands, such as clocked command.

When a read command is issued and a row address and a column address are timely supplied with the read command, read data can be read from memory cells in the memory array 150 designated by these row address and column address. The read command may be received by the command decoder 115, which can provide internal commands to I/O circuit 160 so that read data can be output from the data terminals including DQ and DM via read/write amplifiers and the input/output circuit 160. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ and DM according to the clock signals. The write command may be received by the command decoder 115, which can provide internal commands to the I/O circuit 160 so that the write data can be received by data receivers in the I/O circuit 160, and supplied via the I/O circuit 160 and the read/write amplifiers to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSSQ. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK can be supplied to a clock input circuit 120. The CK clock signals can include different sets of complementary signals. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal (not shown in FIG. 1) from the command decoder 115, an input buffer can receive the CK clock signals. The clock input circuit 120 can receive the external clock signals to generate internal clock signals ICLKT and ICLKB. The internal clock signals ICLKT and ICKLB can be supplied to an internal clock generator 130. The internal clock circuit 130 can provide various phase and frequency controlled internal clock signals based on the received internal clock signals ICLKT, ICLKB, and a clock enable signal CKE from the command/address input circuit 105.

The various phase and frequency controlled internal clock signals can be used by transceivers implementing serializer/deserializers (SERDES) 175 or command/address input circuit 105 for high speed reading and writing with memory cell array 150. SERDES 175 can be additional I/O circuitry that is configured to receive high-speed serialized data and deserialize the data (e.g., parallelize it) and provide the data to memory cell array 150. Additionally, data can be provided from memory cell array 150. To provide the data, a set of phase shifted clock signals as described herein is used.

When data is to be written to memory cell array 150, the bit lines and word lines are configured to allow a capacitor to be charged or discharged based on the logic level of the data. The write operation includes receiving the data signals and data strobe signals DQST and DQSB, and then deserializing the received data signals with the data strobe signals. This includes having command/address input circuit 105 use two clocks that are phase shifted 180 degrees from each other, for example, a first clock that is 0 degrees phase shifted (i.e., a reference clock signal that other clock signals are compared with to determine phase shifts) and a second clock signal that is 180 degrees phase shifted with respect to the first clock signal. In FIG. 1, this is depicted as clock signals 180 providing the 0 degree and 180 degree phase shifted clock signals and generated by internal clock generator 130 and provided to command/address input circuit 105.

By contrast, to read the data stored in memory cell array 150, the charge of the capacitor is "sensed" to determine a logic level indicative of the stored data. The read operation includes using four clocks for SERDES 175 that are phase shifted 90 degrees apart, for example, a first clock that is 0 degrees phase shifted (i.e., a reference clock signal), a second clock signal that is 90 degrees phase shifted from the first clock signal, a third clock signal that is 180 degrees phase shifted form the first clock signal (and 90 degrees phase shifted from the second clock signal), and a fourth clock signal that is 270 degrees phase shifted from the first clock signal (and 90 degrees phase shifted from the third clock signal). Because DQST and DQSB are not provided in the read operation, more phase shifted clock signals are required than write operations.

Figure 2:
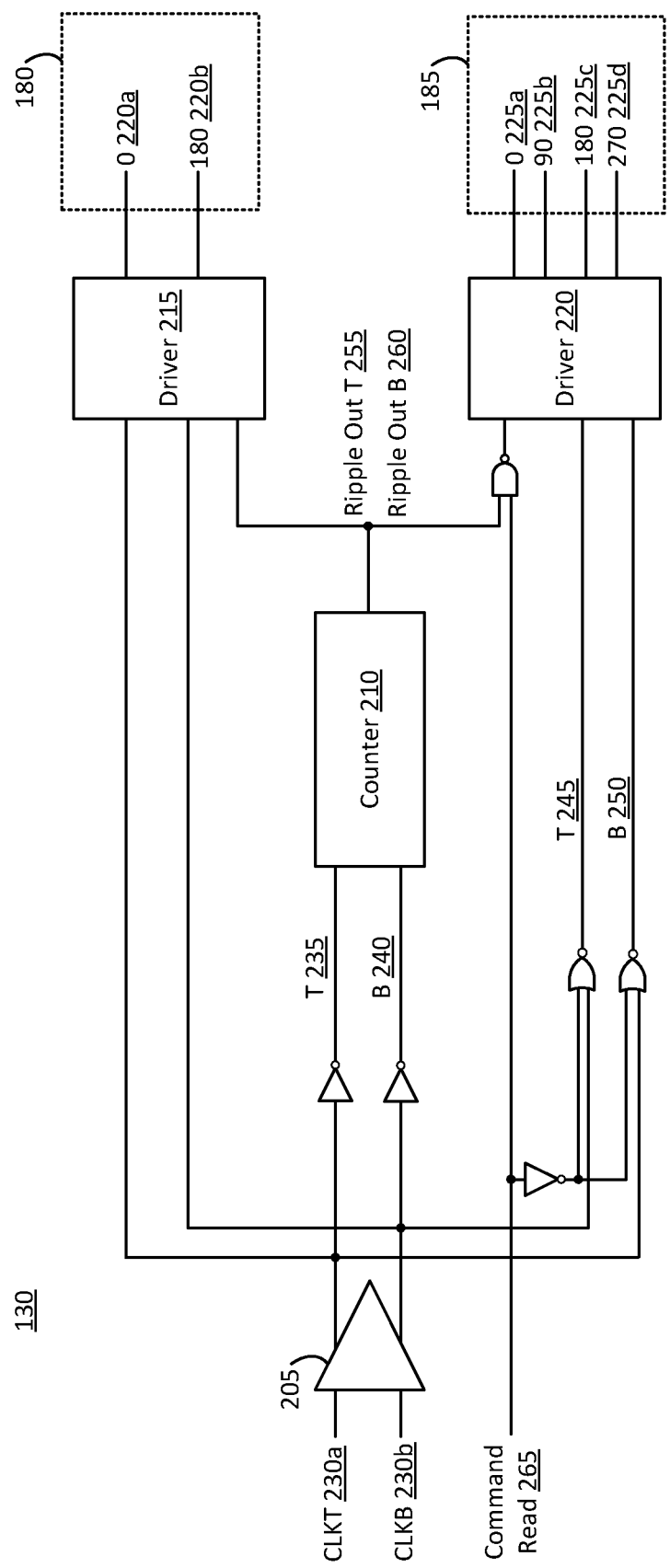
FIG. 2 is a simplified schematic illustrating an internal clock generator circuit for a memory device in accordance with an embodiment of the present technology.

FIG. 2 is a simplified schematic illustrating an internal clock generator circuit for the memory device. In FIG. 2, internal clock circuit generator 130 includes clock buffer 205, counter 210, drivers 215 and 220, as well as interconnect and logic gates to implement separate drivers for providing phase shifted clock signals to be used for command operations. That is, separate drivers 215 and 220 can be used to provide the clock signals for read and command operations, respectively. Command operations can include performing write operations. Here, the read operation includes serializing data in SERDES 175. And the command operations, for instance, include a command signal transferring operation, a timing adjusting operation for the command signal and a latch control operation for the command signal. Although FIG. 1 is depicted such that only command/address input circuit 105 receives two phase shifted clock signals WCCLK0 and WCCLK180, the following circuits 110, 115, 140 and 145 may receive the two phase shifted clock signals. By having separate drivers 215 and 220 to generate the clock signals used by the read and command (including a command to perform a write operation) operations, power consumption can be reduced. For example, when read operations are not being performed, the toggling of the four clock signals 225a-d can be prevented to reduce power consumption. However, the two clock signals 220a and 220b provided by driver 215 can still be provided to enable command operation. Thus, only the two clock signals 220a and 220b can be allowed to toggle. If a single driver was used, then that single driver would have to provide all four phase shifted clock signals even if two of the clock signals are not used by the write command operation.

For example, in FIG. 2, driver 215 can provide first clock signal 220a that is phase shifted at 0 degrees and second clock signal 220b that is phase shifted at 180 degrees. That is, second clock signal 220b can have a same or similar duty cycle (e.g., fifty percent of the period at logic level "1") as first clock signal 220a, but be phase shifted 180 degrees. This results in the clock signal 220a and 220b to be inverse of each other. That is, when clock signal 220a is high, then clock signal 220b is low, and vice versa. Clock signals 220a and 220b are depicted as clock signals 180 in FIG. 1. As depicted in FIG. 1, clock signals 180 are provided to memory-related circuitry including command/address input circuit 105 to perform commands including write operations.

Figure 3:
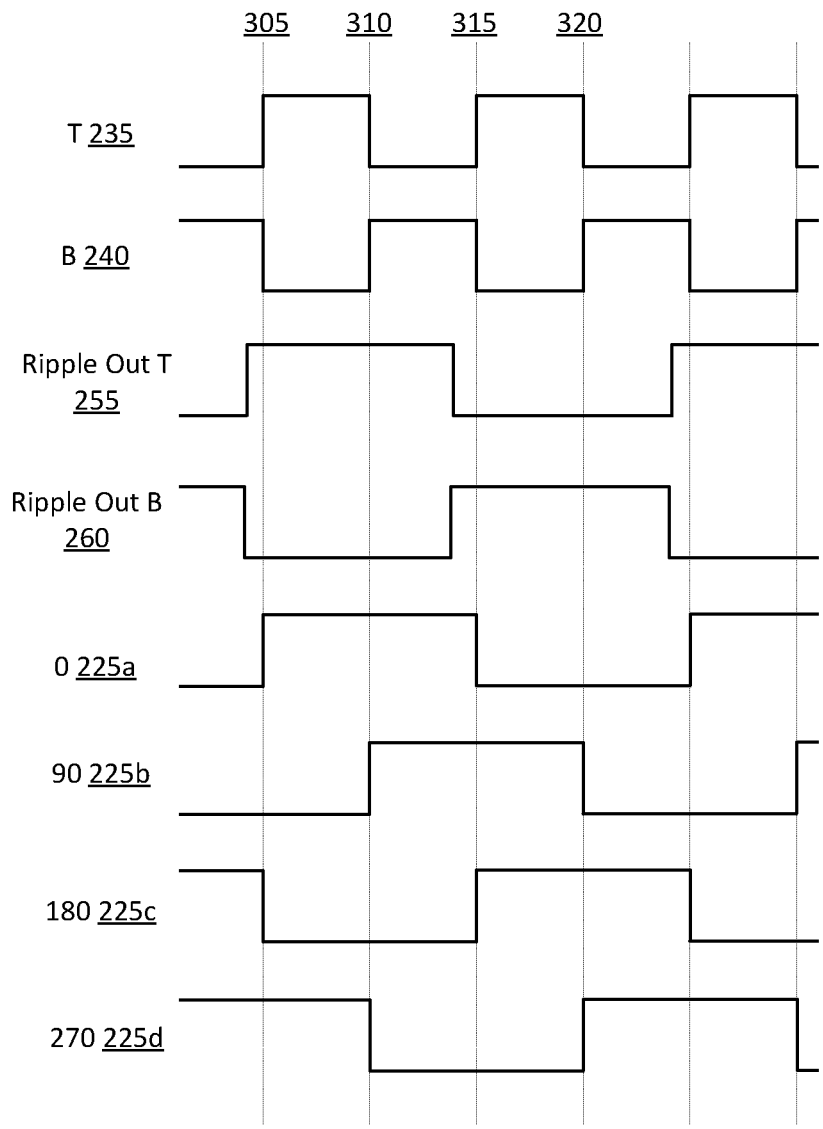
FIG. 3 is an example of a timing diagram for an internal clock generator circuit in accordance with an embodiment of the present technology.

In FIG. 2, driver 220 provides four different clock signals 225a, 225b, 225c, and 225d that are all at the same or similar duty cycle (e.g., also at fifty percent) but all at different phases. For example, first clock signal 225a can be 0 degrees phase shifted and second clock signal 225b can be 90 degrees phase shifted with respect to first clock signal 225a. As depicted and discussed later in FIG. 3, this results in second clock signal 225b to switch logic levels (e.g., rise from a "0" logic level to a "1" logic level) at a different time than first clock signal 225a. Third clock signal 225c can be 180 degrees phase shifted from first clock signal 225a, and fourth clock signal 225c can be 270 degrees phase shifted from first clock signal 225a. As depicted in FIG. 3, all of these clock signals 225a-d rise and fall to different logic levels at different times due to the phase shifts. Clock signals 225a-d are depicted as clock signals 185 in FIG. 1. As depicted in FIG. 1, clock signals 185 are provided to other memory-related circuitry used to interface with memory cell array 150 such as SERDES 175 rather than command/address input circuit 105. As discussed herein, SERDES 175 receives the four different clock signals 225a-d (or clock signals 185) to perform read operations with memory cell array 150.

Counter 210 in FIG. 2 can be an asynchronous counter such as a ripple counter receiving clock signals CLKT 230a and CLKB 230b which can be clock signals with the same duty cycle but inverses of each other. In other implementations, the functionality of counter 210 can be implemented via other circuits, but a ripple counter can allow for a reduced circuit size. Clock buffer 205 receives CLKT 230a and CLKB 230b and provides the clock signals to counter 210. As depicted in FIG. 2, inverters can also be placed between the interconnects between clock buffer 205 and counter 210.

Counter 210 can be used as a clock frequency divider to provide an output clock signal that is a fraction of the input clock signal. For example, in FIG. 2, counter 210 can be a half divider providing output clock signals at half the frequency of the input clock signals CLKT 230a and CLKB 230b. In FIG. 2, this results in the generation of Ripple Out T 255 and Ripple Out B 260 from CLKT 230a and CLKB 230b, respectively. This is also depicted in FIG. 3 where Ripple Out T 255 and Ripple Out B 260 are at half the frequency of T 235 and B 240, respectively. Also as depicted in FIG. 2, T 245 and B 250 are provided to driver 220. In FIG. 2, T 245 and B 250 are also provided to driver 220. T 245 and B 250 are similar signals as T 235 and B 240 provided to counter 210 via other logic gates.

In accordance with one aspect of the subject disclosure, drivers 215 and 220 can include multiple row drivers. That is, drivers 215 and 220 in FIG. 2 can represent "banks" of drivers used to provide the various clock phase shifted signals.

Command read 265 in FIG. 2 is a signal that, when de-asserted (e.g., at a low logic level of "0"), causes driver 220 to prevent toggling of all of clock signals 225a-d. Thus command read 265 can be asserted to cause the toggling of clock signals 225a-d when a read operation is to be performed. Command read 265 can be de-asserted to prevent toggling of clock signals 225a-d when a read operation is not to be performed. Thus, driver 220 can be easily disabled when read operations are not needed and, therefore, clock signals 225a-d are not necessary to be generated, or driven. By contrast, driver 215 for command operations (including write operations) can still be allowed to toggle while driver 220 is deactivated in the aforementioned manner to stop toggling of clock signals 225a-d.

FIG. 3 is an example of a timing diagram for the internal clock generator circuit. In FIG. 3, clock signal 225a providing the 0 degree phase shifted signal (that is driven by driver 220) is based off of T 235 (or T 245) and Ripple out T 255. For example, at time 305, T 235 rises to a high logic level and Ripple Out T 255 rose to a high logic level slightly before time 305. Because both signals are high, clock signal 225a is driven to a high logic level by driver 220. That is, driver 220 provides a high logic level for clock signal 225 for the 0 degree phase shifted signal.

Clock signal 225*c* providing the 180 degree phase shifted signal (by driver 220) is based off of T 235 (or T 245) and Ripple Out B 260. For example, in FIG. 3, at time 315, when T 235 is at a high logic level and Ripple Out B is at a high logic level, then clock signal 225*c* providing the 180 degree phase shifted signal is asserted.

By contrast, clock signal 225*b* providing the 90 degree phase shifted signal and clock signal 225*d* providing the 270 degree phase shifted signal are based on B 240 (or B 250) rather than T 235 (or T 245) as well as the clock signals 225*a* and 225*c*, respectively. For example, clock signal 225*b* providing the 90 degree phase shifted clock signal is asserted to a high logic level when both B 240 (or B 250) and clock signal 225*a* providing the 0 degree phase shifted clock signal are asserted. In FIG. 3, this is depicted at time 310, when clock signal 225*b* is asserted to a high logic level.

For clock signal 225*d* providing the 270 degree phase shifted clock signal, when clock signal 225*c* and B 240 (or B 250) are both asserted, then clock signal 225 is asserted to a high logic level. This is depicted at time 320 in FIG. 3.

Driver 215 provides clock signals 220*a* and 220*b* which are similar to clock signals 225*a* and 225*c* provided by driver 220, respectively. That is, clock signal 220*a* is based on T 235 and Ripple Out T 255, and clock signal 220*b* is based on T 235 and Ripple Out B 260.

Figure 4:
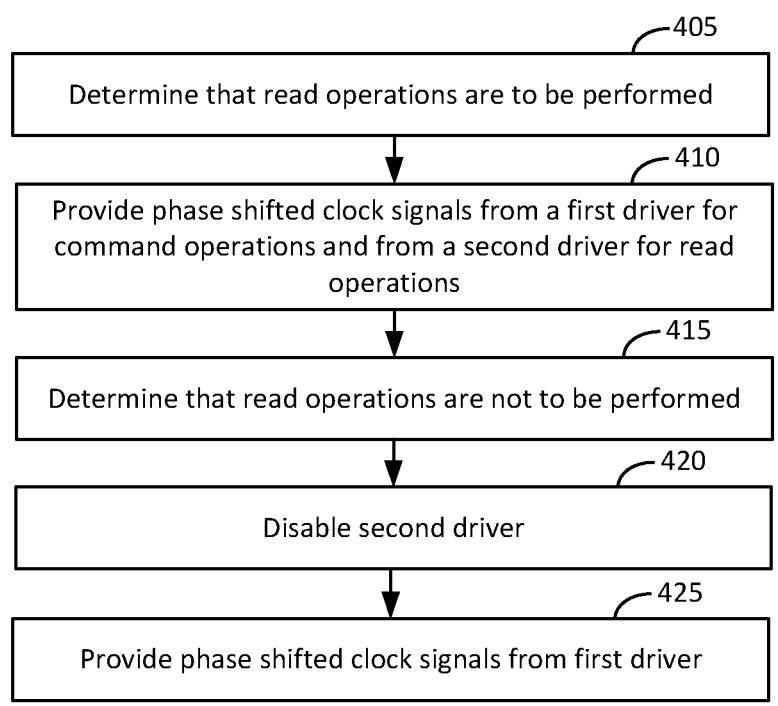
FIG. 4 is an example of a block diagram illustrating a method for operating an internal clock generator circuit in accordance with an embodiment of the present technology.

FIG. 4 is an example of a block diagram illustrating a method for operating the internal clock generator circuit. In FIG. 4, read operations can be determined to be performed (405). For example, a memory controller can receive operations indicating whether data should be read, whether data should be written, or if another command is to be performed. Phase shifted clock signals from a first driver for command operations and from a second driver for read operations can be provided (410). For example, in FIG. 2, driver 215 can provide clock signals 220*a* and 220*b* which are phase shifted 0 degrees and 180 degrees, respectively, to command/address input circuit 105 in FIG. 1 to be used for write (or other types of commands) operations. Additionally, driver 220 can provide clock signals 225*a-d* which are phase shifted 0 degrees, 90 degrees, 180 degrees, and 270 degrees to SERDES 175 in FIG. 1. Next, a determination can be made that read operations are not be performed (415). This results in disabling the second driver (420). For example, in FIG. 2, command read 265 can be controlled such that driver 220 no longer toggles its outputs (i.e., clocks 225*a-d*). As a result, phase shifted clock signals from the first driver are provided (425). For example, in FIG. 2, driver 215 is still providing, or driving, toggling signals for clock signals 220*a* and 220*b* while driver 220 is no longer driving outputs 225*a-d*.

It should be noted that the methods described above describe possible implementations, and that the operations and the steps may be rearranged or otherwise modified and that other implementations are possible. Furthermore, embodiments from two or more of the methods may be combined. Additionally, the circuits described above describe possible implementations, and that the circuitry can be rearranged or otherwise modified and that other implementations are possible.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

We claim:

1. A memory device, comprising:
    an input/output (I/O) circuit;
    a command input circuit;
    a first driver configured to generate a first set of clock signals provided to the command input circuit in implementing a write operation and a read operation; and
    a second driver configured to generate a second set of clock signals provided to the I/O circuit in implementing the read operation, wherein the second driver does not provide the second set of clock signals to the I/O circuit during the write operation.

2. The memory device of claim 1, wherein the first set of clock signals generated by the first driver includes a first clock signal and a second clock signal, the second clock signal phase shifted with respect to the first clock signal.

3. The memory device of claim 2, wherein the second set of clock signals generated by the second driver includes a first clock signal, a second clock signal, a third clock signal, and a fourth clock signal, the first clock signal and the third clock signal of the second set of clock signals having a first phase difference, the first clock signal and the second clock signal of the first set of clock signals also having the phase difference.

4. The memory device of claim 1, further comprising:
a controller circuit configured to determine that a read operation is not to be performed, and configured to disable the second driver based on the determination that the read operation is not to be performed.

5. The memory device of claim 4, wherein the first driver drives the first set of clock signals when the second driver is disabled.

6. The memory device of claim 1, wherein the I/O circuit includes a serializer-deserializer (SERDES).

7. The memory device of claim 1, wherein the second set of clock signals includes more clock signals than the first set of clock signals.

8. A system, comprising:
a memory array;
an input/output (I/O) circuit associated with writing data into the memory array;
a command input circuit associated with reading data from the memory array;
a first driver configured to provide clock signals to the command input circuit in implementing a write operation;
a second driver configured to provide clock signals to the I/O circuit in implementing a read operation; and
circuitry configured to (1) determine the write operation and (2) disable the second driver to no longer toggle the clock signals based on the determination of the write operation.

9. The system of claim 8, wherein the second driver provides more clock signals than the first driver.

10. The system of claim 8, wherein the I/O circuit includes a transceiver.

11. The system of claim 10, wherein the transceiver includes a serializer-deserializer (SERDES).

12. The system of claim 8, wherein clock signals generated by the first driver includes a first clock signal and a second clock signal, the second clock signal phase shifted with respect to the first clock signal.

13. The system of claim 12, wherein the clock signals generated by the second driver includes a first clock signal, a second clock signal, a third clock signal, and a fourth clock signal, the first clock signal and the third clock signal of the clock signals provided by the second driver having a first phase difference, the first clock signal and the second clock signal provided by the first driver also having the phase difference.

14. The system of claim 13, wherein the third clock signal and the fourth clock signal provided by the second driver also have the phase difference.

15. The system of claim 8, further comprising:
a counter configured to receive a first external clock signal and a second external clock signal that is complementary to the first external clock signal, and configured to generate a first frequency divided clock signal that is a fraction of a frequency of the first external clock signal and to generate a second frequency divided clock signal that is the fraction of the frequency of the second external clock signal, and both the first driver and the second driver provide the clock signals based on the first frequency divided clock signal and the second frequency divided clock signal.

16. A method, comprising:
determining that a read operation is to be performed related to a memory;
providing first phase shifted clock signals from a first driver to a first circuit and second phase shifted clock signals from a second driver to a second circuit for the read operation;
determining that a write operation is to be performed;
disabling the second driver for the write operation, disabling the second driver including not toggling the second phase shifted clock signals to no longer provide the second phase shifted clock signals; and
providing the first phase shifted clock signals from the first driver to the first circuit for the write operation.

17. The method of claim 16, wherein the second phase shifted clock signals are provided to input/output (I/O) circuitry related to the memory.

18. The method of claim 17, wherein the I/O circuitry includes serializers-deserializers (SERDES).

19. The method of claim 16, wherein the first phase shifted clock signals provided by the first driver includes a first clock signal and a second clock signal, the second clock signal phase shifted with respect to the first clock signal.

20. The method of claim 19, wherein the second phase shifted clock signals provided by the second driver includes a first clock signal, a second clock signal, a third clock signal, and a fourth clock signal, the first clock signal and the third clock signal of the second phase shifted clock signals having a first phase difference, the first clock signal and the second clock signal of the first phase shifted clock signals also having the phase difference.

* * * * *